United States Patent
Liu et al.

(10) Patent No.: US 9,276,236 B1
(45) Date of Patent: Mar. 1, 2016

(54) OLED ELEMENT

(71) Applicant: Shenzhen China Star Optoelectronics Technology Co., Ltd., Shenzhen, Guangdong (CN)

(72) Inventors: Yawei Liu, Guangdong (CN); Yifan Wang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/424,018

(22) PCT Filed: Feb. 8, 2015

(86) PCT No.: PCT/CN2015/072467
§ 371 (c)(1),
(2) Date: Feb. 25, 2015

(51) Int. Cl.
*H01L 33/00* (2010.01)
*H01L 51/52* (2006.01)
*H01L 27/32* (2006.01)
*H01L 33/54* (2010.01)
*H01L 33/20* (2010.01)
*H01L 33/48* (2010.01)
*H01L 33/52* (2010.01)

(52) U.S. Cl.
CPC ........ *H01L 51/5253* (2013.01); *H01L 27/3244* (2013.01); *H01L 33/20* (2013.01); *H01L 33/48* (2013.01); *H01L 33/52* (2013.01); *H01L 33/54* (2013.01); *H01L 51/529* (2013.01); *H01L 51/5246* (2013.01); *H01L 2251/301* (2013.01)

(58) Field of Classification Search
CPC ......... H01L 33/20; H01L 33/48; H01L 33/52; H01L 33/54
See application file for complete search history.

(56) References Cited

U.S. PATENT DOCUMENTS

| | | | | |
|---|---|---|---|---|
| 2008/0180431 A1* | 7/2008 | Myung | .................. | G09G 3/006 345/212 |
| 2013/0229108 A1* | 9/2013 | Chen | .................... | H01L 51/5253 313/511 |
| 2014/0117333 A1* | 5/2014 | Lee | ...................... | H01L 51/5253 257/40 |
| 2014/0291658 A1* | 10/2014 | Muller | ................ | H01L 51/5253 257/40 |
| 2015/0130736 A1* | 5/2015 | Liu | ........................ | G06F 3/0412 345/173 |
| 2015/0155522 A1* | 6/2015 | Kim | ..................... | H01L 51/5253 257/40 |
| 2015/0169094 A1* | 6/2015 | Liu | ...................... | H01L 51/5262 345/173 |
| 2015/0303400 A1* | 10/2015 | Zhao | ........................ | H01L 51/56 257/40 |
| 2015/0353668 A1* | 12/2015 | Woo | ........................ | C08G 77/20 257/790 |
| 2015/0364718 A1* | 12/2015 | Huang | ................ | H01L 51/0097 257/40 |

* cited by examiner

*Primary Examiner* — Ngan Ngo
(74) *Attorney, Agent, or Firm* — Andrew C. Cheng

(57) ABSTRACT

The present invention provides an OLED element, a substrate (1), an OLED thin film element (2), being positioned on the substrate (1), an organic package thin film (3), being positioned on the substrate (1) and completely covering the OLED thin film element (2), an inorganic package thin film (4), being positioned on the substrate (1) and completely covering the organic package thin film (3), a protective cover (5) sealing the peripheric edges of the substrate (1) and mantling on the inorganic package thin film (4) and a rigid support plate (6) positioned at a side of the protective cover (5) away from the substrate (1). The OLED element of the present invention possesses the better mechanical property and is hard to be damaged by an external force. Meanwhile, the better airtightness protection can be provided to the OLED thin film element.

13 Claims, 1 Drawing Sheet

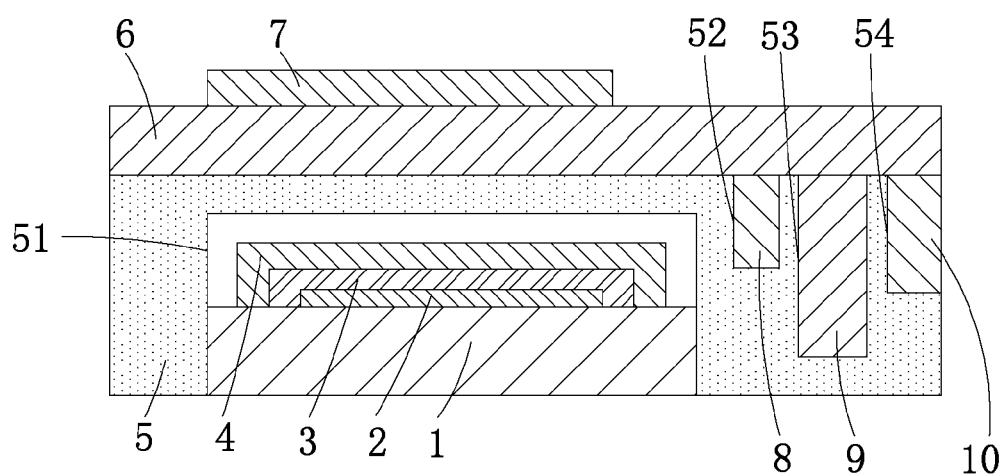

great prospects for development. It does not only possess extremely excellent display performance but also properties of self-illumination, simple structure, ultra thin, fast response speed, wide view angle, low power consumption and capability of realizing flexible display, and therefore is considered as "dream display". Meanwhile, the investment for the production equipments is far smaller than the Liquid Crystal Display (LCD). It has been favored by respective big display makers and has become the main selection of the third generation display element.

OLED ELEMENT

FIELD OF THE INVENTION

The present invention relates to a display technology field, and more particularly to an OLED element.

BACKGROUND OF THE INVENTION

Organic Light Emitting Diode (OLED) is a flat panel display technology which has great prospects for development. It does not only possess extremely excellent display performance but also properties of self-illumination, simple structure, ultra thin, fast response speed, wide view angle, low power consumption and capability of realizing flexible display, and therefore is considered as "dream display". Meanwhile, the investment for the production equipments is far smaller than the Liquid Crystal Display (LCD). It has been favored by respective big display makers and has become the main selection of the third generation display element.

The OLED element generally comprises a glass substrate, an OLED thin film element on the glass substrate and a package cover plate, employed to resist the environmental atmosphere, and prevent the invasion of the water vapor and oxygen into the inside of the OLED element. The package cover plate is another glass plate in general. The OLED thin film element generally comprises an ITO transparent anode located on the glass substrate, a Hole Injection Layer (HIL) located on the ITO transparent anode, a Hole Transporting Layer (HTL) located on the Hole Injection Layer, an emitting material layer (EML) located on the Hole Transporting Layer, an Electron Transport Layer (ETL) located on the emitting material layer, an Electron Injection Layer (EIL) located on the Electron Transport Layer and a Cathode located on the Electron Injection Layer. For promoting the efficiency, the emitting material layer is generally applied with co-host system.

Due to the sharp edges of the glass plate, the issues of the improper protection in the process period can easily happen, and it is fragile as being suffered from mechanical loading. Such problems can be more obvious when it is applied for the large scale OLED elements. Besides, the glass plate (substrate or package cover plate) is very difficult to be connected with traditional fixing ways, such as screws, clamps, drilling, etc. to install the OLED element to the expected locations, such as on the wall.

The present OLEDs have regular shells in general. The regular shell can provide the mechanical package surrounding the outside of the OLED element but not directly contact with the OLED element in the entire shell areas. The robustness of the OLED element itself is not promoted. The mechanical collision will impact the OLED element inside the shell when mechanical collision happens. Ultimately, the OLED element must be damaged. Another kind of shell is to embed the OLED element inside the shell to promote the mechanical property of the OLED embedded inside the shell. However, such kind of shell cannot preserve the OLED element in seal condition and unable to provide better airtightness protection for the OLED thin film element.

Therefore, there is a need to provide a new type OLED element, to significantly promote the mechanical property of the OLED element, and meanwhile, to provide a better airtightness protection.

SUMMARY OF THE INVENTION

An objective of the present invention is to provide an OLED element, which possesses the better mechanical property and is hard to be damaged by an external force. Meanwhile, the better airtightness protection can be provided to the OLED thin film element.

For realizing the aforesaid objectives, the present invention provides an OLED element, comprising a substrate, an OLED thin film element, being positioned on the substrate, an organic package thin film, being positioned on the substrate and completely covering the OLED thin film element, an inorganic package thin film, being positioned on the substrate and completely covering the organic package thin film, a protective cover sealing the peripheric edges of the substrate and mantling on the inorganic package thin film and a rigid support plate, positioned at a side of the protective cover away from the substrate.

A cooler is positioned at a side of the rigid support plate away from the substrate.

The OLED element further comprises a driver controller, being adjacent to the substrate and accommodated in the protective cover, an electronic driver, being adjacent to the driver controller and accommodated in the protective cover, an electric contactor being adjacent to the electronic driver and accommodated in the protective cover; a part of the electric contactor is exposed at a lateral part of the protective cover.

A first accommodating part, and a second, a third and a fourth accommodating parts which opening directions are opposite to that of the first accommodating part are positioned on the protective cover, the substrate is accommodated in the first accommodating part, the driver controller, the electronic driver and the electric contactor are respectively accommodated in the second, the third and the fourth accommodating parts.

A gap is reserved between the protective cover and the inorganic package thin film.

An upper surface and a lower surface of the organic package thin film are adhesive, and material thereof is Parylene, Parylene C or Parylene D.

Material of the inorganic package thin film is silicon nitride, silicon oxide, aluminum oxide or zirconium oxide Material of the protective cover is plastic, and the protective cover is manufactured by injection molding.

The rigid support plate is a stainless plate.

Material of the cooler is aluminum or copper.

The present invention further provides an OLED element, comprising a substrate, an OLED thin film element, being positioned on the substrate, an organic package thin film, being positioned on the substrate and completely covering the OLED thin film element, an inorganic package thin film, being positioned on the substrate and completely covering the organic package thin film, a protective cover sealing the peripheric edges of the substrate and mantling on the inorganic package thin film and a rigid support plate, positioned at a side of the protective cover away from the substrate;

wherein a cooler is positioned at a side of the rigid support plate away from the substrate;

wherein the OLED element further comprises a driver controller, being adjacent to the substrate and accommodated in the protective cover, an electronic driver, being adjacent to the driver controller and accommodated in the protective cover, an electric contactor being adjacent to the electronic driver and accommodated in the protective cover; a part of the electric contactor is exposed at a lateral part of the protective cover;

wherein a gap is reserved between the protective cover and the inorganic package thin film.

The benefits of the present invention are: the present invention provides an OLED element. By covering the organic package thin film and the inorganic package thin film on the OLED thin film element, and mantling the protective cover, which seals the peripheric edges of the substrate on the inorganic package thin film, and positioning the rigid support plate at a side of the protective cover away from the substrate, the OLED element is effectively protected. Meanwhile, the better airtightness protection can be provided to the OLED thin film element to ensure the performance of the OLED thin film element and extend the usage lifetime. Besides, with the protective cover, the OLED element can be more easily installed at any expected locations by the traditional fixing ways.

BRIEF DESCRIPTION OF THE DRAWINGS

The technical solution and the beneficial effects of the present invention are best understood from the following detailed description with reference to the accompanying FIGURES and embodiments.

In drawings,

FIG. 1 is a sectional diagram of the OLED element according to the present invention.

DETAILED DESCRIPTION OF PREFERRED EMBODIMENTS

For better explaining the technical solution and the effect of the present invention, the present invention will be further described in detail with the accompanying drawings and the specific embodiments.

Please refer to FIG. 1. The present invention provides an OLED element, comprising a substrate 1, an OLED thin film element 2, being positioned on the substrate 1, an organic package thin film 3, being positioned on the substrate 1 and completely covering the OLED thin film element 2, an inorganic package thin film 4, being positioned on the substrate 1 and completely covering the organic package thin film 3, a protective cover 5 sealing the peripheric edges of the substrate 1 and mantling on the inorganic package thin film 4 and a rigid support plate 6, positioned at a side of the protective cover 5 away from the substrate 1.

Furthermore, the OLED element further comprises a driver controller 8, being adjacent to the substrate 1 and accommodated in the protective cover 5, an electronic driver 9, being adjacent to the driver controller 8 and accommodated in the protective cover 5, an electric contactor 10 being adjacent to the electronic driver 9 and accommodated in the protective cover 5; a part of the electric contactor 10 is exposed at a lateral part of the protective cover 5, and employed to electrically connected to an external power source for driving the OLED element, accordingly.

A cooler 7 is positioned at a side of the rigid support plate 6 away from the substrate 1.

Specifically, a first accommodating part 51, and a second, a third and a fourth accommodating parts 52, 53, 54 which opening directions are opposite to that of the first accommodating part 51 are positioned on the protective cover 5, the substrate 1 is accommodated in the first accommodating part 51, the driver controller 8, the electronic driver 9 and the electric contactor 10 are respectively accommodated in the second, the third and the fourth accommodating parts 52, 53, 54.

The substrate 1 is a transparent substrate, and employed to allow the OLED thin film element 2 to emit light therethrough. Preferably, the substrate 1 is a glass substrate.

The organic package thin film 3 is similar to a double-side tape, of which an upper surface and a lower surface of the organic package thin film are adhesive, and can be directly adhered to the OLED thin film element 2. Material of the organic package thin film 3 can be Parylene, Parylene C or Parylene D.

Because the structure of the organic package thin film 3 is not compact enough, and the property of isolating the water vapor and oxygen is unsatisfactory, the inorganic package thin film 4 completely covering the organic package thin film 3 is positioned. The structure of the inorganic package thin film 4 is compact enough, and material thereof can be silicon nitride, silicon oxide, aluminum oxide or zirconium oxide. The organic package thin film 3 can prevent the damage to the OLED thin film element 2 during the manufacture process of the inorganic package thin film 4.

The inorganic package thin film 4 and the organic package thin film 3 commonly function to completely seal and isolate the OLED thin film element 2 to provide well airtightness protection for the OLED thin film element 2, which blocks the invasion of the water vapor and oxygen to ensure the performance of the OLED thin film element 2 and extend the usage lifetime.

The protective cover 5 is capable of effectively protecting the OLED element and significantly promoting the mechanical property of the OLED element and making it hard to be damaged by an external force. The protective cover 5 seals the peripheric edges of the substrate 1 without contact with the inorganic package thin film 4. That is to say, a gap is reserved between the protective cover 5 and the inorganic package thin film 4. The protective cover 5 completely seals the OLED element to provide better airtightness protection for the OLED thin film element 2. The electric components of the electronic driver 81, the driver controller 82 and the electric contactor 83 are all covered with by the protective cover 5 together.

Material of the protective cover 5 is plastic, and the protective cover 5 can be manufactured by injection molding as an illustration. Specifically, with the protective cover 5, the OLED element can be more easily installed at any expected locations by the traditional fixing ways.

The rigid support plate 6 is across a side of the entire protective cover 5 away from the substrate 1 which is capable of strengthening the rigidity of the protective cover 5 to protect the OLED better. The rigid support plate 6 is manufactured with hard material. Preferably, the rigid support plate 6 is a stainless plate.

Material of the cooler 7 is aluminum or copper with better thermal dissipation, employed to dissipate the heat generated by the OLED element in functioning period for preventing badness of the OLED element caused by the over high temperature.

In conclusion, in the OLED element of the present invention, by covering the organic package thin film and the inorganic package thin film on the OLED thin film element, and mantling the protective cover, which seals the peripheric edges of the substrate on the inorganic package thin film, and positioning the rigid support plate at a side of the protective cover away from the substrate, the OLED element is effectively protected and the mechanical property of the OLED element is promoted. Meanwhile, the better airtightness protection can be provided to the OLED thin film element to ensure the performance of the OLED thin film element and extend the usage lifetime. Besides, with the protective cover, the OLED element can be more easily installed at any expected locations by the traditional fixing ways.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An OLED element, comprising a substrate, an OLED thin film element, being positioned on the substrate, an organic package thin film, being positioned on the substrate and completely covering the OLED thin film element, an inorganic package thin film, being positioned on the substrate and completely covering the organic package thin film, a protective cover sealing the peripheric edges of the substrate and mantling on the inorganic package thin film and a rigid support plate, positioned at a side of the protective cover away from the substrate.

2. The OLED element according to claim 1, wherein a cooler is positioned at a side of the rigid support plate away from the substrate.

3. The OLED element according to claim 1, further comprising a driver controller, being adjacent to the substrate and accommodated in the protective cover, an electronic driver, being adjacent to the driver controller and accommodated in the protective cover, an electric contactor being adjacent to the electronic driver and accommodated in the protective cover; a part of the electric contactor is exposed at a lateral part of the protective cover.

4. The OLED element according to claim 3, wherein a first accommodating part, and a second, a third and a fourth accommodating parts which opening directions are opposite to that of the first accommodating part are positioned on the protective cover, the substrate is accommodated in the first accommodating part, the driver controller, the electronic driver and the electric contactor are respectively accommodated in the second, the third and the fourth accommodating parts.

5. The OLED element according to claim 1, wherein a gap is reserved between the protective cover and the inorganic package thin film.

6. The OLED element according to claim 1, wherein an upper surface and a lower surface of the organic package thin film are adhesive, and material thereof is Parylene, Parylene C or Parylene D.

7. The OLED element according to claim 1, wherein material of the inorganic package thin film is silicon nitride, silicon oxide, aluminum oxide or zirconium oxide.

8. The OLED element according to claim 1, wherein material of the protective cover is plastic, and the protective cover is manufactured by injection molding.

9. The OLED element according to claim 1, wherein the rigid support plate is a stainless plate.

10. The OLED element according to claim 2, wherein material of the cooler is aluminum or copper.

11. An OLED element, comprising a substrate, an OLED thin film element, being positioned on the substrate, an organic package thin film, being positioned on the substrate and completely covering the OLED thin film element, an inorganic package thin film, being positioned on the substrate and completely covering the organic package thin film, a protective cover sealing the peripheric edges of the substrate and mantling on the inorganic package thin film and a rigid support plate, positioned at a side of the protective cover away from the substrate;

wherein a cooler is positioned at a side of the rigid support plate away from the substrate;

wherein the OLED element further comprises a driver controller, being adjacent to the substrate and accommodated in the protective cover, an electronic driver, being adjacent to the driver controller and accommodated in the protective cover, an electric contactor being adjacent to the electronic driver and accommodated in the protective cover; a part of the electric contactor is exposed at a lateral part of the protective cover;

wherein a gap is reserved between the protective cover and the inorganic package thin film.

12. The OLED element according to claim 11, wherein a first accommodating part, and a second, a third and a fourth accommodating parts which opening directions are opposite to that of the first accommodating part are positioned on the protective cover, the substrate is accommodated in the first accommodating part, the driver controller, the electronic driver and the electric contactor are respectively accommodated in the second, the third and the fourth accommodating parts.

13. The OLED element according to claim 11, wherein an upper surface and a lower surface of the organic package thin film are adhesive, and material thereof is Parylene, Parylene C or Parylene D;

wherein material of the inorganic package thin film is silicon nitride, silicon oxide, aluminum oxide or zirconium oxide;

wherein material of the protective cover is plastic, and the protective cover is manufactured by injection molding;

wherein the rigid support plate is a stainless plate;

wherein material of the cooler is aluminum or copper.

* * * * *